United States Patent [19]

Taylor

[11] 4,388,588
[45] Jun. 14, 1983

[54] FLUSH MOUNTABLE PLASMA DENSITY PROFILE PROBE DEVICE

[75] Inventor: Leonard S. Taylor, Silver Spring, Md.

[73] Assignee: The United States of America as represented by the Secretary of the Navy, Washington, D.C.

[21] Appl. No.: 242,086

[22] Filed: Mar. 9, 1981

[51] Int. Cl.³ .......................................... G01R 31/02
[52] U.S. Cl. ................................................. 324/72.5
[58] Field of Search .................. 324/72.5, 457, 158 P, 324/149, 446, 464, 459, 452, 72

[56] References Cited

U.S. PATENT DOCUMENTS

| | | | |
|---|---|---|---|
| 3,559,056 | 1/1971 | Easi ..................................... | 324/72.5 |
| 3,750,013 | 7/1973 | Rotman et al. ....................... | 324/58 |
| 3,753,102 | 8/1973 | Beck ..................................... | 324/72 |
| 4,006,404 | 2/1977 | Szuszczewicz et al. .............. | 324/72 |

OTHER PUBLICATIONS

Bredfeldt et al., Boundary Layer Ion Density Profiles as Measured by Electrostatic Probes, Jan. 1967, pp. 93–94, AIAA Journal.

Primary Examiner—Michael J. Tokar
Assistant Examiner—Kevin O'Shea
Attorney, Agent, or Firm—R. S. Sciascia; A. L. Branning; J. G. Wynn

[57] ABSTRACT

Information about the plasma density profile in an aerodynamic flow field of plasma adjacent a supersonic space vehicle or test model is provided by a flush mountable plasma density profile probe device having at least three striplines embedded in and separated by a dielectric support member from a conducting ground plane therebelow. In operation, the device is affixed flush and conformally to the surface of the space vehicle or test model. The plasma density profile is determined from a plot of data points derived from sequential measurements, in the plasma flow field environment, of the conduction between a driven stripline and parallel flush embedded additional striplines in the order of the nearest stripline to the furtherest stripline from the driven stripline. Standard formulas can be applied to determine the data points.

3 Claims, 5 Drawing Figures

FLUSH MOUNTABLE PLASMA DENSITY PROFILE PROBE DEVICE

BACKGROUND OF THE INVENTION

1. Field of the Invention

This invention relates generally to plasma density measurement and particularly to a device for measuring the plasma density profile in aerodynamic flow fields about supersonic space vehicles or test models.

2. Description of the Prior Art

It is important in the field of plasma measurement to be able to measure the plasma density profile about a space vehicle traveling at supersonic speeds during reentry or of a test model under simulated reentry conditions in order to predict or determine the effect of the plasma sheath on radio-wave transmission, reception, and diffraction. A plasma sheath is an envelope of ionized gas that surrounds the space vehicle or test model moving through an atmosphere at a supersonic velocity.

Heretofore, a number of devices have been used to measure the plasma density in aerodynamic flow fields about supersonic bodies. These include microwave and radio frequency probe devices. For small test models, like those contemplated for use with the present invention, such devices are too large to be carried abroad the model. In addition, these devices do not provide useful information about the plasma density profile.

As background information, one such device is disclosed in U.S. Pat. No. 3,750,013, filed Oct. 21, 1970, by Rotman et al., entitled, "Microstrip Plasma Probe", granted July 31, 1973. Rotman et al. disclose a microstrip cavity type transmission line having a lossy center conductor which provides attenuation and reflection coefficient information in response to the disturbing effects of conducting plasma proximate to the transmission line. Equivalent conductance and susceptance of the plasma is determined by using the foregoing information to solve standard transmission line formulas.

Thus, the information gathered by the device of Rotman et al. will allow calculation of certain electrical properties of the plasma very close to the surface of the space vehicle or test model. The information gathered is not useful to calculate or predict the plasma density as a function of distance away from the surface of the space vehicle or test model i.e., a measure of the plasma density profile.

Consequently, there is a need in the prior art for a device to provide information useful for determining the plasma density profile, but yet be small enough to be carried abroad or be mounted flush to the surface of a test model.

A simple device for measuring plasma density which can be carried aboard or be mounted flush to the surface of a test model is a dc flush mountable double probe. These devices have been used to measure the plasma density in aerodynamic flow fields about test models, but they suffer from the defect that they can only provide information about the plasma density which is an average of the values close to the surface of the test model. The information gained in this situation is not a measure of the plasma density profile.

Hence, there is a need in the prior art to modify the standard dc flush mountable double probe to permit a measurement of the plasma density profile about a test model in an aerodynamic flow field.

The representative prior art, as outlined hereinabove, include many advances in plasma measurement techniques; however, insofar as can be determined, no prior art device incorporates all of the features and advantages of the present invention.

OBJECTS OF THE INVENTION

Accordingly, an important object of the present invention is to design a device to gather information useful for determining the plasma density profile about a test model in an aerodynamic flow field, but yet be small enough to be carried abroad or be mounted flush to the surface of the test model.

Another object of the present invention is to modify a dc flush mountable double probe to permit a measurement of the plasma density profile about a test model in an aerodynamic flow field.

SUMMARY OF THE INVENTION

In accordance with these and other objects and features of the present invention, a flush mountable plasma density profile probe device includes a plurality of striplines embedded in and separated by a dielectric support member from a conducting ground plane below and affixed to the dielectric support member. Although alignment is not critical, the striplines are aligned along an axis perpendicular to the latitudinal axis of the test model. The striplines are disposed adjacent and parallel each other and are isolated from each other by the dielectric support member. The width of each stripline is made small compared to the spacing between striplines, so that the conduction path is principally in the plasma flow field surrounding the device.

A voltage potential placed across one of the outer most striplines generates an electric field which results in an induced voltage potential between each of the other striplines and the conducting ground plane. Each of these voltage potentials depends on the potential drop on associated fringing field lines of the electric field which links each stripline to the driven outer most stripline. Hence, these induced voltage potentials depend upon the conductive properties of the plasma flow field through which each associated fringing field line of the electrical field traverses. The induced voltage potential at each stripline is measured and sequentially telemetered using standard techniques. The conduction between each of the other (further) striplines and the outer (near) driven stripline is a measure of the plasma density as a function of the distance away from the surface of the test model.

For stripline spacing small compared to the thickness of the near plasma layer, the conductivity measurement yields the value of conductivity in the near plasma layer. On the other hand, for stripline spacing large compared to the thickness of the near plasma layer, the conductivity of the further plasma layers are taken into account in the form of more data points. Thus, with these additional points, a plot of the conductivity in the plasma field, i.e., plasma density, as a function of the distance from the surface of the test model can be made. This plot is the plasma density profile.

BRIEF DESCRIPTION OF THE DRAWINGS

The foregoing, other objects, novel features and advantages of the present invention will be apparent from the following more particular description of the preferred embodiment as illustrated in the accompanying drawings, in which.

DETAILED DESCRIPTION OF THE PREFERRED EMBODIMENT

Figure 1:
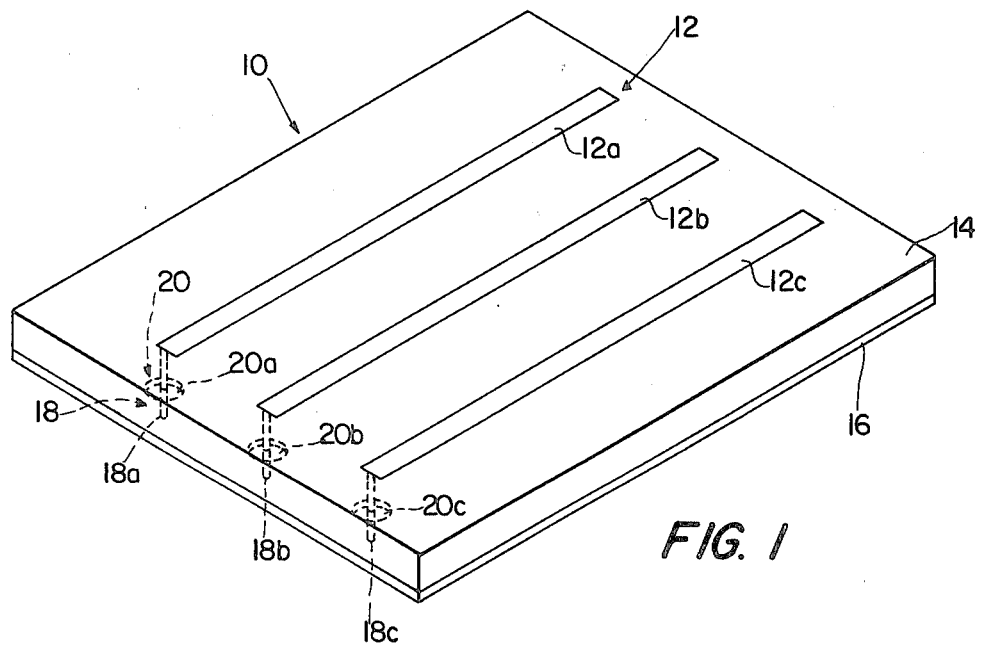
FIG. 1 is an isometric view of a plasma density profile probe device according to the present invention depicting three striplines, the minimum number necessary to comprise a plasma density profile probe device.

Referring to FIG. 1, a flush mountable plasma density profile probe device 10 includes a plurality of striplines 12, each additionally represented by the letters a, b, c . . . z, as shown. Each of the plurality of striplines 12 is embedded in a dielectric support member 14 even with the top surface thereof and parallel to each other, i.e., juxtaposed. A conducting ground plane 16 is affixed to the bottom surface of dielectric support member 14. Electrical connections to the plurality of striplines 12 are made via a plurality of line conductors 18, which in turn, pass through a plurality of mating ground plane irises 20. Each of the plurality of line conductors 18 and mating ground plane irises 20 are additionally represented by the letters a, b, c . . . z, as shown.

Figure 2:
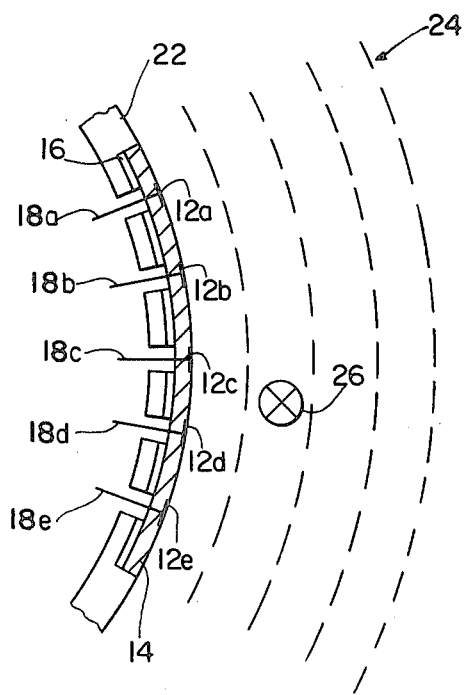
FIG. 2 is a cross sectional view of a plasma density profile probe device according to the present invention arranged conformally with the geometric shape of the surface of a test model of a operating in a plasma flow field.

Referring to FIG. 2, a plasma density profile probe device according to the present invention is shown flush mounted and operatively affixed to a vehicle surface 22 of a test model (not shown). As illustrated, the probe device is arranged conformally with the geometrical shape of the test model which is usually cylindrical or conical in shape. As also shown, the probe device includes additional striplines 12d and 12e. Electrical connections to striplines 12d and 12e are made via line conductors 18d and 18e, respectively. The aforementioned line conductors, in turn, pass through mating ground plane irises 20d and 20e, respectively. And as depicted, the ground plane irises are extended through vehicle surface 22. The probe device flush mounted to vehicle surface 22 is in an aerodynamic flow field of plasma 24 represented by a plurality of layered dotted lines. Directional arrow 26 indicates that the field flow is into the drawing. More aspects of the plasma flow field and its coaction with the present invention will be discussed in the "Statement of the Operation" hereinbelow.

Figure 3:
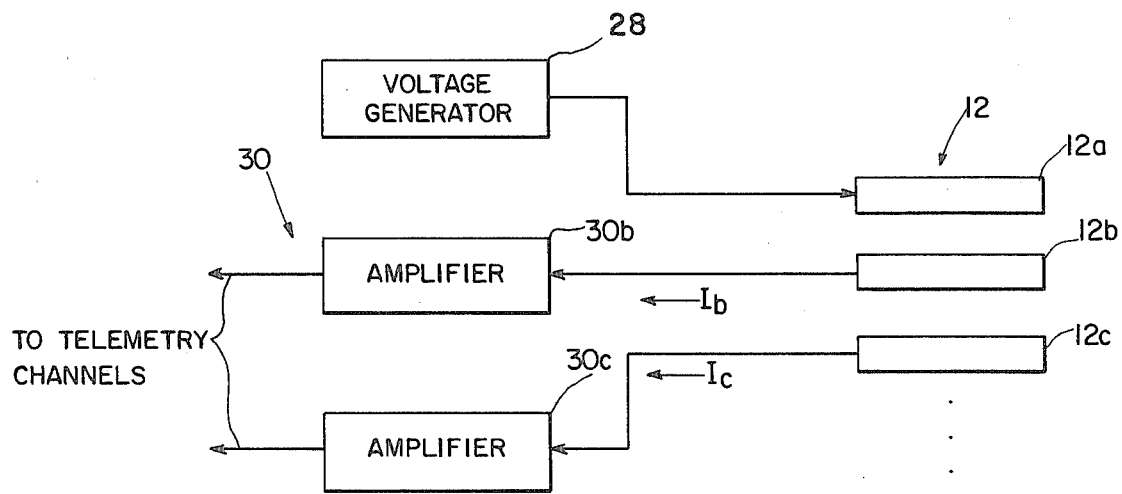
FIG. 3 is a block diagram representation of the electronic circuitry used to drive the plasma density profile probe device and to receive data therefrom according to the present invention.

FIG. 3 shows the electronic circuitry, in block diagram form, used to drive the plasma density profile probe device and to receive data therefrom, according to the present invention. The circuitry includes a voltage generator 28 operatively connected to, for example, stripline 12a of plurality of striplines 12. A plurality of amplifiers 30 are each, in turn, connected to the remaining striplines. Each of the plurality of amplifiers 30 are additionally represented by the letters b, c, d . . . z. The outputs of the plurality of amplifiers 30 are connected to a plurality of telemetry channels (not shown) where they are sequentially telemetered using standard well known techniques.

STATEMENT OF THE OPERATION

Proper operation is dependent to some extent on the physical parameters of the device according to the present invention. Referring again to FIG. 1, plasma density profile probe device 10 is miniature. Each of the plurality of striplines 12 must be thin and short compared to any distance over which the plasma flow field conductivity changes. Thus, for purposes of the invention, each stripline is about 0.2 mm wide and 8.0 mm long. The distance between the outermost striplines, e.g., striplines 12a and 12c, is comparable to the thickness of the plasma flow field to be measured. The plasma density profile probe device 10 of FIG. 1 is approximately 1.0 cm square and about 1.0 mm thick.

Figure 4:
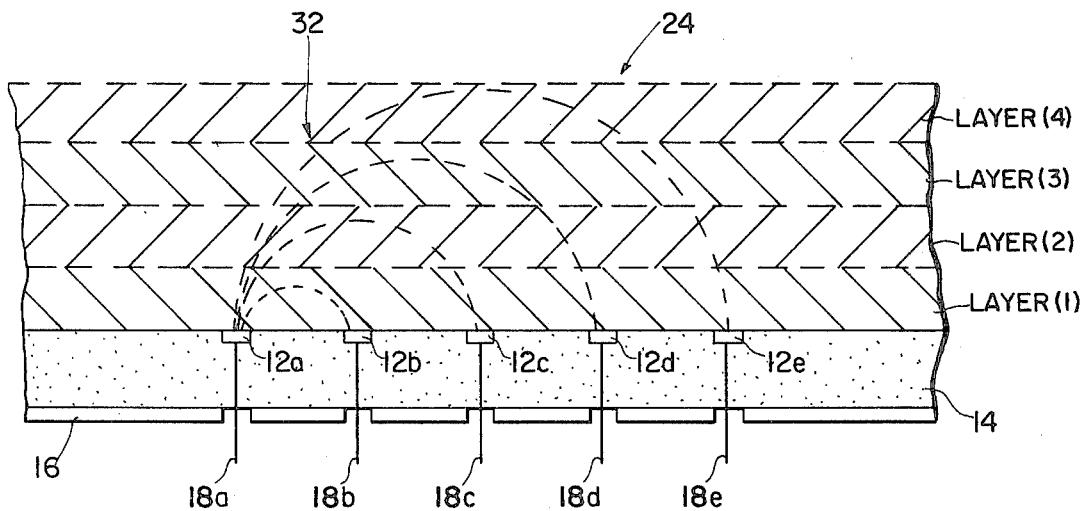
FIG. 4 depicts, inter alia, a model of N−1 layers of plasma of unknown density, where N is the number of striplines in the plasma density profile probe device according to the present invention.

Referring now to FIG. 3 and FIG. 4 viewed concurrently, operation of the device according to the present invention is based on the fact that an electric field 32 produced by stripline 12a, when driven by voltage generator 28, supported by dielectric support member 14 above conducting ground plane 16, fringes out above the conducting ground plane. For purposes of the present invention, voltage generator 28 drives stripline 12a with a dc voltage of about 10 volts. However, it should be understood that proper operation of the present invention will take place when stripline 12a is driven with signals having frequencies up to about 100 Hz. When another stripline 12b is placed parallel to stripline 12a, it will assume a voltage potential $V_b$ with respect to conducting ground plane 16. The equation for this voltage potential is $V_b = V_a - V_{ab}$, where $V_a$ is the voltage potential at stripline 12a and $V_{ab}$ is the potential drop along a fringing field line of electric field 32 from stripline 12a to stripline 12b. Thus, voltage potential $V_{ab}$ is measured as the difference between the potentials $V_a$ and $V_b$ and conducting ground plane 16.

The current $I_b$ shown in FIG. 3 is given by $V_{ab}/R$, where R is proportional to the resistivity of the aerodynamic flow field of plasma 24 integrated along the fringing field line path from stripline 12a to stripline 12b.

The way in which the foregoing measured quantities can be related to the physical properties of the adjacent aerodynamic flow field of plasma 24 can be seen by referring again to FIG. 4. As depicted, the distance between the outermost striplines 12a and 12e is comparable to the thickness of the adjacent aerodynamic flow field of plasma 24, as previously mentioned. Plasma 24 is mathematically modeled by N−1 layers of plasma 24 of unknown density, where N is the number of striplines 12. Five striplines 12 are used in the example, but it should be understood that no more than three striplines 12 are needed for proper operation of the present invention. Accordingly, a set of functional relations exist between the voltage potentials V of each of the plurality of striplines 12 and the integrated resistivities R through the layers (1) through (4) of plasma 24 along the associated fringing field lines of electric field 32. Thus, along the associated fringing field lines from stripline 12a to striplines 12b, 12c, 12d and 12e: $V_{ab} = V_{ab}(R_1, R_2, R_3, R_4)$; $V_{ac} = V_{ac}(R_1, R_2, R_3, R_4)$; $V_{ad} = V_{ad}(R_1, R_2, R_3, R_4)$; and $V_{ae} = V_{ae}(R_1, R_2, R_3, R_4)$, respectively. These relations can be obtained, for example, by computer solutions for the electric field in the plasma layer model chosen and for the number of striplines chosen for the plasma density profile probe device.

By inverting, the integrated resistivities $R_1$, $R_2$, $R_3$, and $R_4$ are determined as functions of the measured voltage potentials at striplines 12b, 12c, 12d and 12e, i.e., $R_1 = R_1 (V_{ab}, V_{ac}, V_{ad}, V_{ae})$, etc. Consequently, the resistivity R of each plasma layer (1) through (4) of plasma 24 can be determined by computation.

Figure 5:
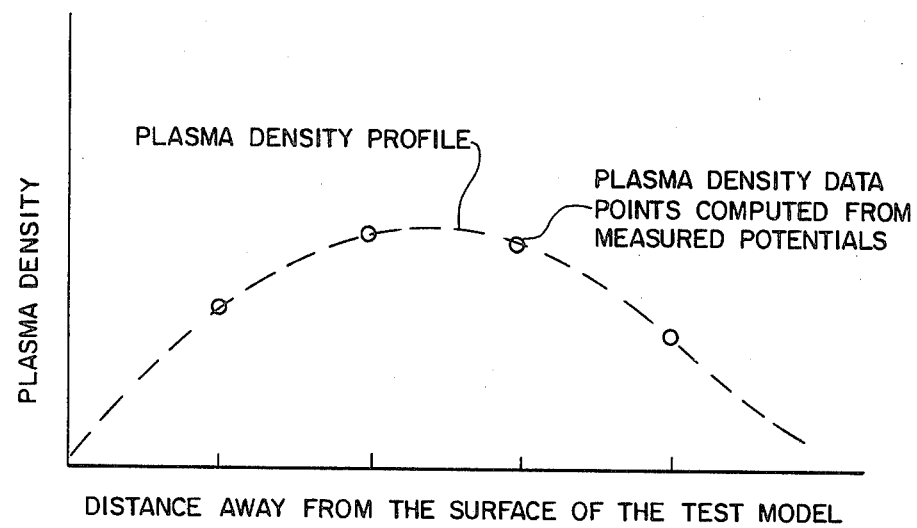
FIG. 5 is a graphic representation of the conductivity in the plasma flow field (the plasma density) versus the distance away from the surface of the test model.

Referring to FIG. 5, the foregoing resistivity values $R_1$, $R_2$, etc., are then employed to plot a profile of plasma density. The horizonal axis of the graph employs as a parameter the distance away from the surface of the test model. The points along the axis correspond to the thicknesses of each of the layers (1) through (4) of plasma 24. The intersection of the horizontal and vertical axis corresponds to the condition of zero conductivity in layer (1) of plasma 24 at vehicle surface 22. The vertical axis of the graph employs as a parameter the plasma density. The plasma density is equivalent to the number density (N) of the plasma, where N is equal to the number of electrons per unit volume of plasma. Also, $N \propto 1/R$, where R, as stated before, is the integrated resistivities through the layers (1) through (4) of plasma 24. Hence, the points along the vertical axis correspond to the computed values of plasma density employing the computed values of resistivity of each layer (1) through (4) of plasma 24.

To those skilled in the art, many modifications and variations of the present invention are possible in light of the above teachings. It is therefore to be understood that the present invention can be practiced otherwise than as specifically described herein and still be within the spirit and scope of the appended claims.

What is claimed is:

1. A plasma density profile probe device configured to be flush mountable to a surface of a test model and arranged conformally with the geometric shape thereof for measuring information about the density profile of an adjacent plasma flow field, comprising:
   a dielectric support member;
   a plurality of striplines, numbering at least three, embedded in one side of said dielectric support member;
   a conducting ground plane affixed contiguously to the other side of said dielectric support member, said conducting ground plane having a plurality of mating conducting ground plane irises configured therein, each of said plurality of mating conducting ground plane irises being disposed subjacent to each of said plurality of striplines, and said conducting ground plane further including a plurality of line conductors each passing through corresponding ones of said plurality of mating conducting ground plane irises and being affixed to corresponding ones of said plurality of striplines for providing electrical connections thereto;
   a voltage generator operatively connected via one of said plurality of line conductors to a corresponding outer one of said plurality of striplines for driving it with a fixed voltage potential sufficient to induce fringing field lines of an electric field into the adjacent plasma flow field out above said conducting ground plane; and
   a plurality of amplifiers each being operatively connected via the other ones of said plurality of line conductors to corresponding other ones of said plurality of striplines for amplifying the current change in the fringing electric field lines as they are being influenced by the adjacent plasma flow field at each of said other ones of said plurality of striplines.

2. The device of claim 1 wherein said fixed voltage potential is a dc voltage at a level of 10 volts.

3. The device of claim 2 wherein the distance between the outermost striplines of said plurality of striplines is comparable to the thickness of the adjacent plasma flow field to be measured.

* * * * *